(12) United States Patent
Yang et al.

(10) Patent No.: US 12,417,996 B2
(45) Date of Patent: Sep. 16, 2025

(54) LAYOUT STRUCTURE OF DIFFERENTIAL LINES, MEMORY STORAGE DEVICE AND MEMORY CONTROL CIRCUIT UNIT

(71) Applicant: PHISON ELECTRONICS CORP., Miaoli (TW)

(72) Inventors: Kang-Yun Yang, Hsinchu County (TW); Yang-Tse Hung, Hsinchu County (TW); Chao-Cheng Ku, Taoyuan (TW); Li-Yuan Lee, Taipei (TW)

(73) Assignee: PHISON ELECTRONICS CORP., Miaoli (TW)

( * ) Notice: Subject to any disclaimer, the term of this patent is extended or adjusted under 35 U.S.C. 154(b) by 275 days.

(21) Appl. No.: 18/306,971

(22) Filed: Apr. 25, 2023

(65) Prior Publication Data
US 2024/0312949 A1   Sep. 19, 2024

(30) Foreign Application Priority Data
Mar. 17, 2023 (TW) .................................. 112110034

(51) Int. Cl.
*G11C 5/06* (2006.01)
*G11C 16/14* (2006.01)
*H01L 23/00* (2006.01)

(52) U.S. Cl.
CPC ................ *H01L 24/49* (2013.01); *G11C 5/06* (2013.01); *G11C 16/14* (2013.01); *H01L 2224/4912* (2013.01)

(58) Field of Classification Search
CPC ... H01L 24/49; H01L 2224/4912; G11C 5/06; G11C 16/14

USPC ............................................................ 365/63
See application file for complete search history.

(56) References Cited

U.S. PATENT DOCUMENTS

| | | | | |
|---|---|---|---|---|
| 6,833,756 B2 * | 12/2004 | Ranganathan | ...... | H03F 3/45071 330/252 |
| 7,161,855 B2 * | 1/2007 | Kodama | .................. | G11C 7/22 365/194 |
| 7,259,467 B2 * | 8/2007 | Inagawa | ................. | H01L 23/50 257/E23.079 |
| 7,825,526 B2 * | 11/2010 | Dirks | ...................... | H01L 24/49 257/786 |

(Continued)

OTHER PUBLICATIONS

"Office Action of Taiwan Counterpart Application", issued on May 16, 2024, p. 1-p. 4.

*Primary Examiner* — Viet Q Nguyen
(74) *Attorney, Agent, or Firm* — JCIPRNET (57) ABSTRACT

A layout structure of differential lines, a memory storage device and a memory control circuit unit are provided. The layout structure of the differential lines includes a wiring layer, a first wire and a second wire. The first wire is arranged on the wiring layer and configured to transmit a first differential signal. The second wire is arranged on the wiring layer and configured to transmit a second differential signal. A first end of the first wire and a first end of the second wire are coupled to a first electrical component. A second end of the first wire and a second end of the second wire are coupled to a second electrical component. The first end of the first wire has a first bending structure. One of the second end of the first wire and the second end of the second wire has a second bending structure.

18 Claims, 5 Drawing Sheets

(56) References Cited

U.S. PATENT DOCUMENTS

| | | | | |
|---|---|---|---|---|
| 7,839,652 | B2* | 11/2010 | Ohsaka | H01L 23/66 |
| | | | | 361/767 |
| 8,443,333 | B2* | 5/2013 | Orita | G06F 30/394 |
| | | | | 716/139 |
| 11,171,126 | B2* | 11/2021 | Murtuza | H05K 1/0286 |
| 11,765,813 | B2* | 9/2023 | Charbonneau | H05K 1/0225 |
| | | | | 174/251 |
| 2002/0056912 | A1 | 5/2002 | Roth et al. | |
| 2004/0159970 | A1* | 8/2004 | Gorman | B29C 59/025 |
| | | | | 264/166 |
| 2008/0012107 | A1* | 1/2008 | Isa | H01L 23/49838 |
| | | | | 257/E23.079 |
| 2008/0174371 | A1* | 7/2008 | Aghahassan | H03F 3/45475 |
| | | | | 330/307 |
| 2009/0014206 | A1* | 1/2009 | Motohashi | H05K 1/114 |
| | | | | 174/262 |

* cited by examiner

LAYOUT STRUCTURE OF DIFFERENTIAL LINES, MEMORY STORAGE DEVICE AND MEMORY CONTROL CIRCUIT UNIT

CROSS-REFERENCE TO RELATED APPLICATION

This application claims the priority benefit of Taiwan application serial no. 112110034, filed on Mar. 17, 2023. The entirety of the above-mentioned patent application is hereby incorporated by reference herein and made a part of this specification.

BACKGROUND

Technical Field

The disclosure relates to a wiring technology for a circuit board, and particularly to a layout structure of differential lines, a memory storage device, and a memory control circuit unit.

Description of Related Art

Generally, wires configured to transmit differential signals are paired together and also called differential lines. Differential signals transmitted through paired differential lines have the characteristics of the same amplitude and opposite phases. The paired differential lines are generally designed to be equal in length, so as to make the delay time of the transmitted differential signals as consistent as possible. However, in practice, even if the length of the paired differential lines is adjusted to be almost the same, the transmitted differential signals may still have inconsistent delay time, thereby affecting the transmission quality of the signals.

Nothing herein should be construed as an admission of knowledge in the prior art of any portion of the present disclosure. Furthermore, citation or identification of any document in this application is not an admission that such document is available as prior art to the present disclosure, or that any reference forms a part of the common general knowledge in the art.

SUMMARY

The disclosure provides a layout structure of differential lines, a memory storage device and a memory control circuit unit, which may improve the transmission quality of differential signals.

The exemplary embodiment of the disclosure provides a layout structure of differential lines includes a wiring layer, a first wire and a second wire. The first wire is arranged on the wiring layer and configured to transmit a first differential signal. The second wire is arranged on the wiring layer and configured to transmit a second differential signal. A first end of the first wire and a first end of the second wire are coupled to a first electrical component. A second end of the first wire and a second end of the second wire are coupled to a second electrical component. The first end of the first wire has a first bending structure. One of the second end of the first wire and the second end of the second wire has a second bending structure.

The exemplary embodiment of the disclosure also provides a memory storage device including a layout structure of differential lines and a rewritable non-volatile memory module. The rewritable non-volatile memory module is coupled to the layout structure of the differential lines. The layout structure of the differential lines includes a wiring layer, a first wire and a second wire. The first wire is arranged on the wiring layer and configured to transmit a first differential signal. The second wire is arranged on the wiring layer and configured to transmit a second differential signal. A first end of the first wire and a first end of the second wire are coupled to a first electrical component. A second end of the first wire and a second end of the second wire are coupled to a second electrical component. The first end of the first wire has a first bending structure. One of the second end of the first wire and the second end of the second wire has a second bending structure.

The exemplary embodiment of the disclosure also provides a memory control circuit unit configured to control a rewritable non-volatile memory module. The memory control circuit unit includes the layout structure of the differential lines, including a wiring layer, a first wire and a second wire. The first wire is arranged on the wiring layer and configured to transmit a first differential signal. The second wire is arranged on the wiring layer and configured to transmit a second differential signal. A first end of the first wire and a first end of the second wire are coupled to a first electrical component. A second end of the first wire and a second end of the second wire are coupled to a second electrical component. The first end of the first wire has a first bending structure. One of the second end of the first wire and the second end of the second wire has a second bending structure.

Based on the above, in the layout structure of the differential lines, the first wire and the second wire are both arranged on the wiring layer and configured to transmit the first differential signal and the second differential signal respectively. In particular, the transmission quality of the differential signals may be effectively improved through the arrangement of the first bending structure at the first end of the first wire and the arrangement of the second bending structure at one of the second end of the first wire and the second end of the second wire.

It should be understood, however, that this Summary may not contain all of the aspects and embodiments of the present disclosure, is not meant to be limiting or restrictive in any manner, and that the disclosure as disclosed herein is and will be understood by those of ordinary skill in the art to encompass obvious improvements and modifications thereto.

DESCRIPTION OF THE EMBODIMENTS

Reference will now be made in detail to the present preferred embodiments of the disclosure, examples of which are illustrated in the accompanying drawings. Wherever possible, the same reference numbers are used in the drawings and the description to refer to the same or like parts.

Embodiments of the present disclosure may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

A plurality of exemplary embodiments are provided below to describe the disclosure, though the disclosure is not limited to the provided exemplary embodiments, and the exemplary embodiments can also be suitably combined. A term "couple" used in the full text of the disclosure (including the claims) refers to any direct and indirect connections. For example, if a first device is described to be coupled to a second device, it is interpreted as that the first device is directly coupled to the second device, or the first device is indirectly coupled to the second device through other devices or connection means. Moreover, a term "signal" refers to at least a current, a voltage, an electric charge, a temperature, data or any other one or a plurality of signals.

Figure 1:
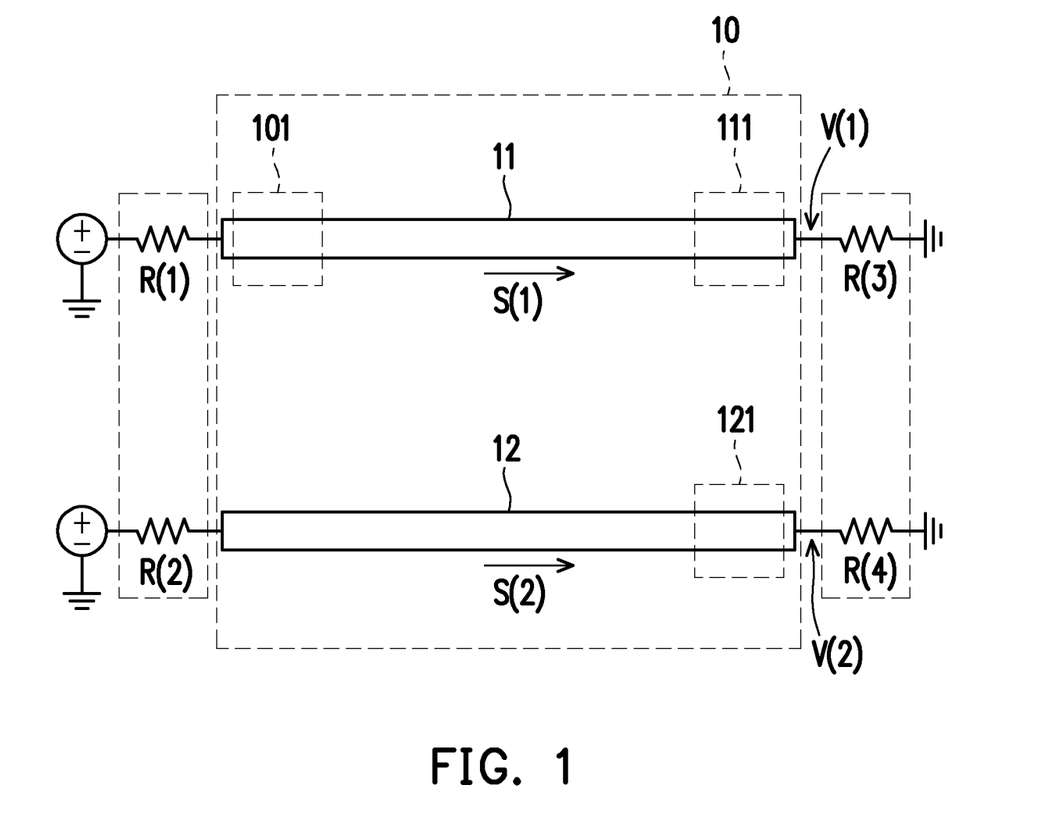
FIG. 1 is a schematic diagram of an equivalent circuit of a layout structure of differential lines according to an exemplary embodiment of the disclosure.

FIG. 1 is a schematic diagram of an equivalent circuit of a layout structure of differential lines according to an exemplary embodiment of the disclosure.

Referring to FIG. 1, a layout structure (also referred to as a layout structure of differential lines) includes a wiring layer 10, a wire (also referred to as the first wire) 11, and a wire (also referred to as the second wire) 12. The wires 11 and 12 are both arranged on the wiring layer 10. One end (or terminal) of the wire 11 (also referred to as the first end) is coupled to an impedance component R(1). One end (or terminal) of the wire 12 (i.e., the first end) is coupled to an impedance component R(2). The other end (or terminal) of the wire 11 (also referred to as the second end) is coupled to an impedance component R(3). The other end (or terminal) of the wire 12 (i.e., the second end) is coupled to an impedance component R(4).

In an exemplary embodiment, the impedance components R(1) and R(2) may be collectively referred to as a first electrical component, and/or the impedance components R(3) and R(4) may be collectively referred to as a second electrical component. In an exemplary embodiment, the impedance components R(1) to R(4) are all exemplified as resistors. However, in an exemplary embodiment, the impedance components R(1) to R(4) may also be replaced or further coupled with other types of electrical components (such as capacitors, inductors, or transistors, etc.) according to practical needs, and the disclosure is not limited thereto.

The wire 11 is configured to transmit a signal (also referred to as a first differential signal) S(1). The wire 12 is configured to transmit a signal (also referred to as a second differential signal) S(2). The signals S(1) and S(2) are paired differential signals. For example, the signal S(1) may include a D+ signal, and signal S(2) may include a D-signal. At a certain time point, the signals S(1) and S(2) have the same amplitude and the phases thereof are opposite. For example, at a certain time point, the phase difference between the signals S(1) and S(2) may be about 180 degrees. In an exemplary embodiment, the wires 11 and 12 may also be considered as paired differential lines (or differential signal lines). Those skilled in the art would know what differential signals and differential lines are, and therefore no related description is further provided here.

It should be noted that the first end of the wire 11 may have a bending structure 101. The second end of the wire 11 may have a bending structure 111 and/or the second end of the wire 12 may have a bending structure 121. The bending structure 101 is also referred to as the first bending structure, and at least one of the bending structures 111 and 121 is also referred to as the second bending structure. In the bending structures 101 and 111, a portion of the wire 11 may bend (or fold). Similarly, in the bending structure 121, a portion of the wire 12 may bend (or fold). In addition, the wire 11 or 12 may have one or more bending structures, and the disclosure is not limited in this regard.

In an exemplary embodiment, the first bending structure (e.g., the bending structure 101) and the second bending structure (e.g., the bending structures 111 and/or 121) may be configured to jointly affect the endpoint voltages of the wire 11 and the wire 12. For example, the endpoint voltage of the wire 11 may include voltage V(1), and the endpoint voltage of the wire 12 may include voltage V(2). For instance, by appropriately arranging the first bending structure and the second bending structure, the endpoint voltages (i.e., the voltage V(1) and V(2)) of the wires 11 and 12 may be effectively controlled (e.g., at a certain time point, the absolute value of the voltage V(1) (i.e., the amplitude of the signal S(1)) may be accurately controlled to be almost equal to the absolute value of the voltage V(2) (i.e., the amplitude of the signal S(2))), thereby improving the transmission quality of the signals S(1) and S(2) transmitted synchronously through the wires 11 and 12.

In an exemplary embodiment, the first bending structure (e.g., the bending structure 101) and the second bending structure (e.g., the bending structures 111 and/or 121) may be configured to jointly affect the delay of the signals S(1) and S(2). For example, by appropriately arranging the first bending structure and the second bending structure, the delay of the signal S(1) in the wire 11 and the delay of the signal S(2) in the wire 12 may be effectively controlled (e.g., the delay of the signal S(1) and the delay of the signal S(2) may be accurately controlled to be almost the same or the delay deviation between the signals S(1) and S(2) may be reduced), thereby improving the transmission quality of the signals S(1) and S(2) transmitted synchronously through the wires 11 and 12.

Figure 2:
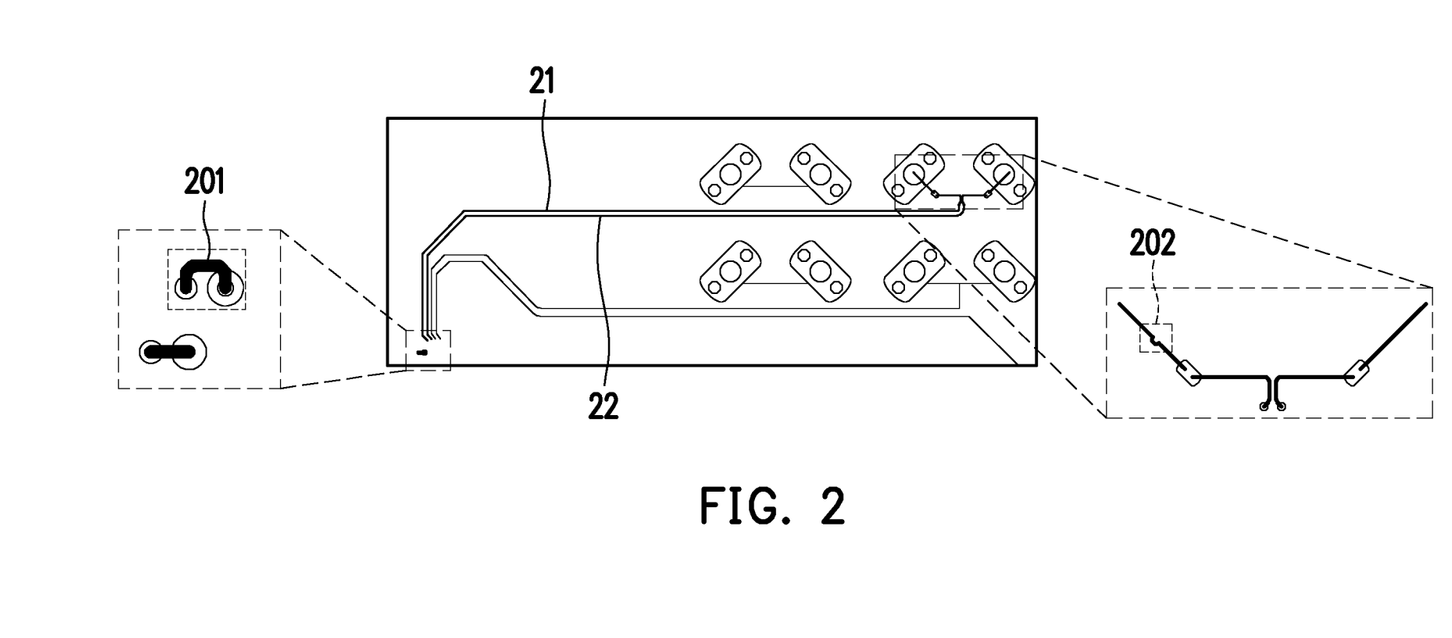
FIG. 2 is a schematic diagram of a layout structure of differential lines according to an exemplary embodiment of the disclosure.

FIG. 2 is a schematic diagram of a layout structure of differential lines according to the exemplary embodiment of the disclosure.

Referring to FIGS. 1 and 2, the wire 11 may include the wire 21, and the wire 12 may include the wire 22. The wires 21 and 22 may be configured to transmit paired differential signals (e.g., the signals S(1) and S(2)).

It should be noted that the first end of the wire 21 has a bending structure 201 (i.e., the first bending structure). In the bending structure 201, a portion of the wire 21 may bend (or fold). In addition, the second end of the wire 21 has a bending structure 202 (i.e., the second bending structure). In the bending structure 202, another portion of the wire 21 may bend (or fold). Alternatively, in an exemplary embodiment, the bending structure 202 may also be arranged at the second end of the wire 22, depending on practical needs.

The bending structures 201 and 202 may be configured to jointly affect (e.g., adjust) the endpoint voltages of the wires 21 and 22. Alternatively, from another perspective, the bending structures 201 and 202 may be configured to jointly affect (e.g., adjust) the delay of the differential signal transmitted through the wires 21 and 22. In this way, the transmission quality of the differential signal transmitted synchronously through the wires 21 and 22 may be effectively improved, such as improving the synchronization rate of the differential signal transmitted through the wires 21 and 22.

In an exemplary embodiment, under the influence of the first bending structure and the second bending structure, the difference value between the total length of the first wire (i.e., the total line length of the first wire) and the total length of the second wire (i.e., the total line length of the second wire) may be greater than a predetermined length. For example, this predetermined length may be 3 mils. 1 mil is equal to 25.4 micrometers (μm). It should be noted that the predetermined length may be adjusted according to practical needs, and the disclosure is not limited thereto.

In an exemplary embodiment, the arrangement of the first bending structure and the second bending structure is not for bypass of specific components. Taking FIG. 2 as an example, the arrangement of the bending structures 201 and 202 is not for bypass of specific components. For instance, there is no any electronic circuit components that need to be bypassed within the bending range of the wires 21 and 22 in the bending structures 201 and 202.

In an exemplary embodiment, the length of the first bending structure in a certain direction (also referred to as the first direction) is not greater than a threshold value (also referred to as the first threshold value), the length of the first bending structure in another direction (also referred to as the second direction) is not greater than another threshold value (also referred to as the second threshold value), and the first direction is perpendicular to the second direction. For example, the first threshold value may be 30 mils and/or the second threshold value may be 15 mils. In an exemplary embodiment, the first direction is parallel to the wiring direction of the first wire. In an exemplary embodiment, the first direction may be any other direction. It should be noted that both the first threshold value and the second threshold value may be adjusted according to practical needs, and the disclosure is not limited thereto.

Figure 3:
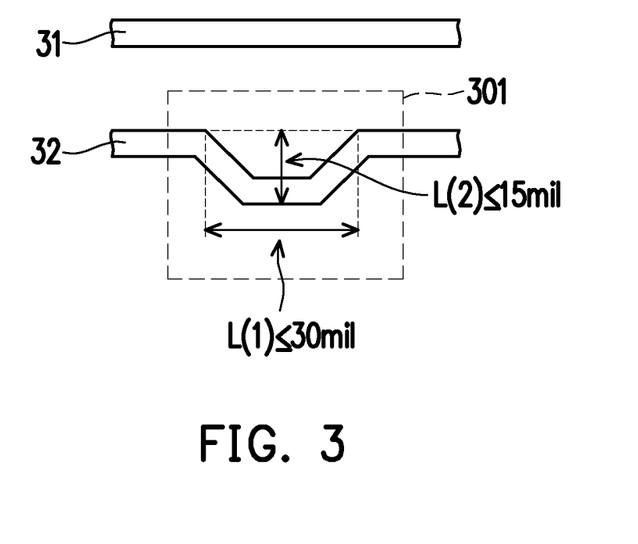
FIG. 3 is a schematic diagram of a bending structure according to an exemplary embodiment of the disclosure.

FIG. 3 is a schematic diagram of a bending structure according to an exemplary embodiment of the disclosure.

Referring to FIG. 3, the wires 31 and 32 are paired differential lines. The first end and/or the second end of the wire 32 have a bending structure 301. The length L(1) of the bending structure 301 in the first direction is not greater than the first threshold value (e.g., 30 mils), and the length L(2) of the bending structure 301 in the second direction is not greater than the second threshold value (e.g., 15 mils). In addition, the first direction may be parallel to the wiring direction of the wire 32, as shown in FIG. 3.

In an exemplary embodiment, the length of the first bending structure in the first direction and/or the length of the first bending structure in the second direction may be greater than or less than a specific threshold value or may be within a specific numerical range, and the disclosure is not limited thereto. Additionally, the same or similar restrictions may also be applied to the second bending structure.

In an exemplary embodiment, the first end of the first wire and the first bending structure may be located in a specific area (also referred to as the first area) of the first wire. For example, the coverage range of the first area may occupy a predetermined proportion of the total length of the first wire. For example, this predetermined proportion may be ⅜. The same or similar restrictions may also be applied to the second bending structure. For example, the second end of the first wire and the second bending structure may be located in another specific area (also referred to as the second area) of the first wire. For example, the coverage range of the second area may also occupy the predetermined proportion of the total length of the first wire.

Alternatively, the second end of the second wire and the second bending structure may be located in a specific area (also referred to as the third area) of the second wire. For example, the coverage range of the third area may occupy the predetermined proportion of the total length of the second wire. It should be noted that the predetermined proportion may be adjusted according to practical needs, and the disclosure is not limited thereto.

Taking FIG. 2 as an example, assuming that the total length of the wire 21 is N mils and the total length of the wire 22 is M mils, the bending structure 201 may be located in the wire 21 and within the range of N×⅜ mils of the first end of the wire 21, and the bending structure 202 may be located in the wire 21 and within the range of N×⅜ mils of the second end of the wire 21 (or the bending structure 202 may be located in the wire 22 and within the range of M×⅜ mils of the second end of the wire 22).

It should be noted that the actual arrangement of the first bending structure and/or the second bending structure may also be adjusted according to practical needs, and the disclosure is not limited thereto. In addition, the bending angle of at least one bending point of the first bending structure and/or the second bending structure may also be determined or adjusted according to practical needs, and the disclosure is not limited thereto.

Figure 4:
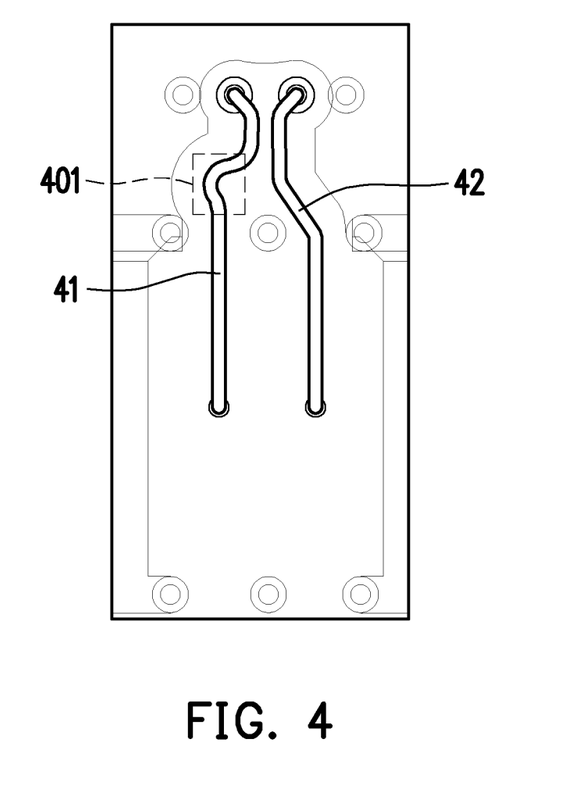
FIG. 4 is a schematic diagram of differential lines and a bending structure according to an exemplary embodiment of the disclosure.

FIG. 4 is a schematic diagram of differential lines and a bending structure according to an exemplary embodiment of the disclosure.

Referring to FIG. 4, the wires 41 and 42 are paired differential lines. One end of the wire 41 has a bending structure 401. In particular, the bending structure 401 may be configured to affect the endpoint voltages of the wires 41 and/or 42, and the arrangement of the bending structure 401 is not for bypass of specific components.

Figure 5:
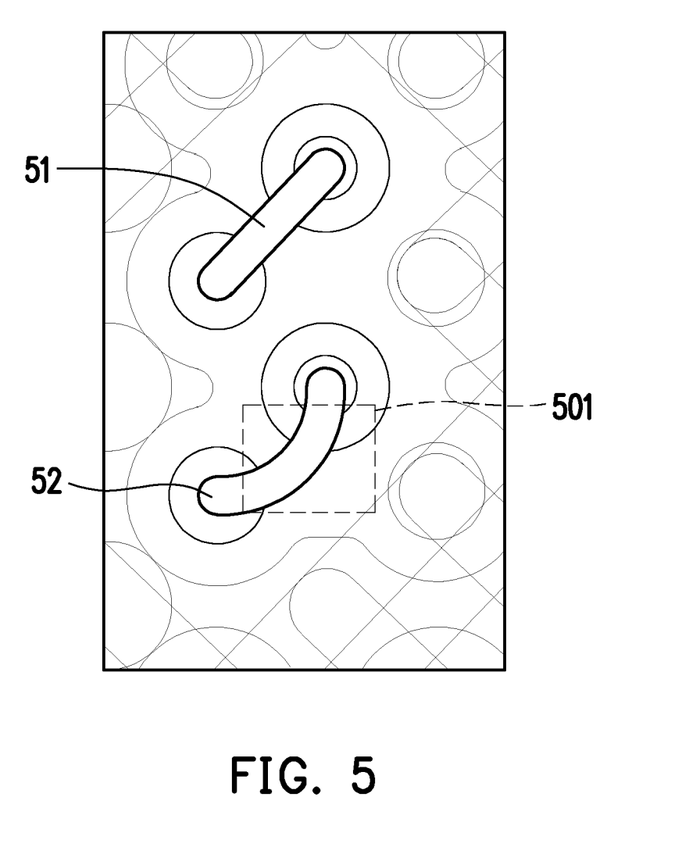
FIG. 5 is a schematic diagram of differential lines and a bending structure according to an exemplary embodiment of the disclosure.

FIG. 5 is a schematic diagram of differential lines and a bending structure according to an exemplary embodiment of the disclosure.

Referring to FIG. 5, the wires 51 and 52 are paired differential lines. One end of the wire 52 has a bending structure 501. In particular, the bending structure 501 may be configured to affect the endpoint voltages of the wires 51 and/or 52, and the arrangement of the bending structure 501 is not for bypass of specific components.

Figure 6:
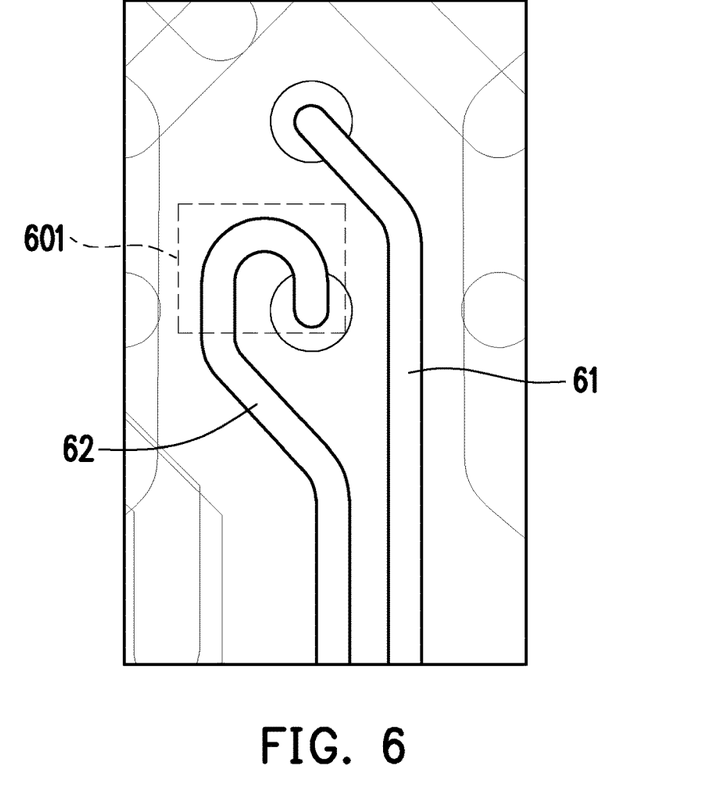
FIG. 6 is a schematic diagram of differential lines and a bending structure according to an exemplary embodiment of the disclosure.

FIG. 6 is a schematic diagram of differential lines and a bending structure according to an exemplary embodiment of the disclosure.

Referring to FIG. 6, the wires 61 and 62 are paired differential lines. One end of the wire 62 has a bending structure 601. In particular, the bending structure 601 may be configured to affect the endpoint voltages of the wires 61 and/or 62, and the arrangement of the bending structure 601 is not for bypass of specific components.

In an exemplary embodiment, the layout structure of the differential lines may be arranged in a memory storage device. Alternatively, in an exemplary embodiment, the aforementioned layout structure of the differential lines may also be arranged in any type of electronic devices, and the disclosure is not limited thereto.

Figure 7:
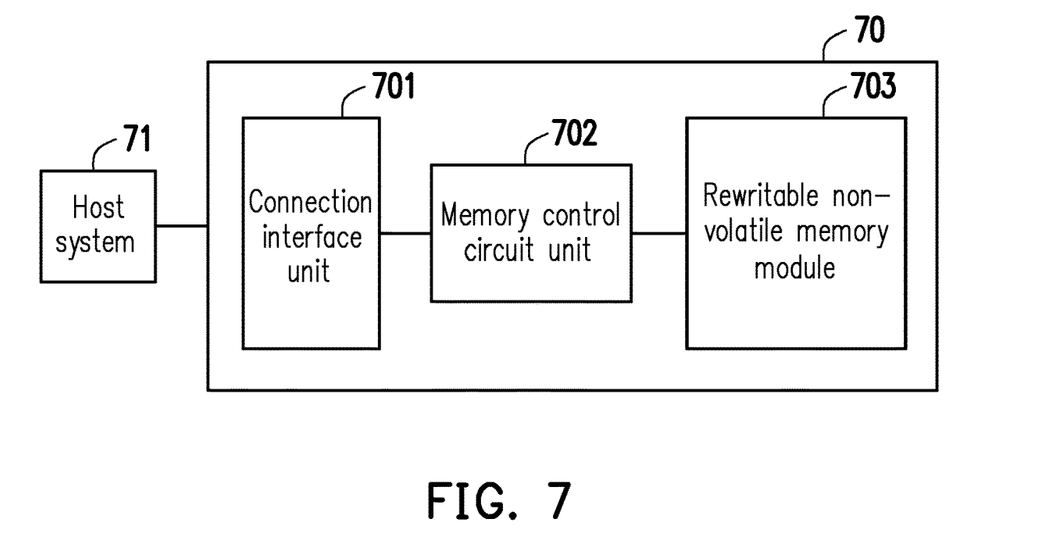
FIG. 7 is a schematic diagram of a memory storage device according to an exemplary embodiment of the disclosure.

FIG. 7 is a schematic diagram of a memory storage device according to an exemplary embodiment of the disclosure.

Please refer to FIG. 7, the memory storage device 70 includes a connection interface unit 701, a memory control circuit unit 702, and a rewritable non-volatile memory module 703. The aforementioned layout structure of the differential lines may be arranged in the memory storage device 70.

The connection interface unit 701 is configured to couple the memory storage device 70 to a host system 71. The memory storage device 70 may communicate with the host system 71 through the connection interface unit 701. In an exemplary embodiment, the connection interface unit 701 is compatible with the Peripheral Component Interconnect Express (PCI Express) standard. In another exemplary embodiment, the connection interface unit 701 may also be compliant with the Serial Advanced Technology Attachment (SATA) standard, the Parallel Advanced Technology Attachment (PATA) standard, the Institute of Electrical and Electronic Engineers (IEEE) 1394 standard, the Universal Serial Bus (USB) standard, the SD interface standard, the Ultra High Speed-I (UHS-I) interface standard, the Ultra High Speed-II (UHS-II) interface standard, the Memory Stick (MS) interface standard, the MCP interface standard, the MMC interface standard, the eMMC interface standard, the Universal Flash Storage (UFS) interface standard, the eMCP interface standard, the CF interface standard, the Integrated Device Electronics (IDE) standard, or other suitable standards. The connection interface unit 701 may be packaged with the memory control circuit unit 702 in a single chip, or the connection interface unit 701 may be arranged outside the chip including the memory control circuit unit 702.

The memory control circuit unit 702 is coupled to the connection interface unit 701 and the rewritable non-volatile memory module 703. The memory control circuit unit 702 is configured to execute multiple logic gates or control instructions implemented in a hardware form or a firmware form, and perform operations, such as data writing, reading, and erasing, in the rewritable non-volatile memory module 703, according to the instructions from the host system 11. For example, the memory control circuit unit 702 may include a flash memory controller.

The rewritable non-volatile memory module 703 is configured to store data written from the host system 71. The rewritable non-volatile memory module 703 may include a single-level cell (SLC) NAND flash memory module (i.e., a flash memory module that can store one bit per cell), a multi-level cell (MLC) NAND flash memory module (i.e., a flash memory module that can store two bits per cell), a triple-level cell (TLC) NAND flash memory module (i.e., a flash memory module that can store three bits per cell), a quad-level cell (QLC) NAND flash memory module (i.e., a flash memory module that can store four bits per cell), other flash memory modules, or other memory modules with similar characteristics.

Each cell (i.e., memory cell) in the rewritable non-volatile memory module 703 stores one or more bits by changing the voltage (also referred to as the threshold voltage). Specifically, there is a charge trapping layer between the control gate and the channel of each cell. By applying a write voltage to the control gate, the number of electrons in the charge trapping layer may be changed, thereby changing the threshold voltage of the cell. This operation of changing the threshold voltage of the cell is also called "writing data to the cell" or "programming the cell". With the change of the threshold voltage, each cell in the rewritable non-volatile memory module 703 has multiple storage states. By applying a read voltage, it can be determine which storage state a cell belongs to, and thus to obtain one or more bits stored in the cell.

In an exemplary embodiment, the cells of the rewritable non-volatile memory module 703 may form multiple physical programming units, and these physical programming units may form multiple physical erasing units. Specifically, the cells on the same word line may form one or more physical programming units. If a cell can store more than one bit, then the physical programming units on the same word line may be at least classified into the lower physical programming unit and the upper physical programming unit. For example, the least significant bit (LSB) of a cell belongs to the lower physical programming unit, and the most significant bit (MSB) of a cell belongs to the upper physical programming unit. Generally, in MLC NAND flash memory, the write speed of the lower physical programming unit is greater than that of the upper physical programming unit, and/or the reliability of the lower physical programming unit is higher than that of the upper physical programming unit.

In an exemplary embodiment, the physical programming unit is the smallest unit for programming. That is, the physical programming unit is the smallest unit for writing data. For example, the physical programming unit may be a physical page or a physical sector. If the physical programming unit is a physical page, physical programming units may include a data bit area and a redundant bit area. The data bit area includes multiple physical sectors for storing user data, while the redundant bit area is configured to store system data (such as error correcting codes and other management data). In an exemplary implementation, the data bit area may include 32 physical sectors, and the data capacity of each physical sector may be 512 bytes. However, in other exemplary embodiment, the data bit area may also include 8, 16, or a different number of physical sectors, and the data capacity of each physical sector may be larger or smaller. On the other hand, the physical erasing unit is the smallest unit for erasing. That is, each physical erasing unit includes the minimum number of cells to be erased together. For example, the physical erasing unit may be a physical block.

In an exemplary embodiment, the aforementioned layout structure of the differential lines (including the wires 11 and 12 in FIG. 1) may be arranged in the connection interface unit 701 to transmit differential signals in the connection interface unit 701. Alternatively, in an exemplary embodiment, the aforementioned layout structure of the differential lines (including the wires 11 and 12 in FIG. 1) may also be arranged in the memory control circuit unit 702 and/or the rewritable non-volatile memory module 703 to transmit differential signals in the memory control circuit unit 702 and/or the rewritable non-volatile memory module 703. In addition, at least one of the connection interface unit 701, the memory control circuit unit 702, and the rewritable non-volatile memory module 703 may be coupled to the wiring layer 10 in FIG. 1.

In summary, the layout structure of the differential lines, the memory storage device, and the memory control circuit unit proposed in the exemplary embodiment of the disclosure may effectively improve the transmission quality of the differential signals transmitted through the differential lines by arranging additional bending structures at the first and/or second ends of the paired differential lines.

The previously described exemplary embodiments of the present disclosure have the advantages aforementioned, wherein the advantages aforementioned not required in all versions of the disclosure.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A layout structure of differential lines, comprising:
    a wiring layer;
    a first wire arranged on the wiring layer and configured to transmit a first differential signal; and
    a second wire arranged on the wiring layer and configured to transmit a second differential signal, wherein a first end of the first wire and a first end of the second wire are coupled to a first electrical component, a second end of the first wire and a second end of the second wire are coupled to a second electrical component, the first end of the first wire has a first bending structure and one of the second end of the first wire and the second end of the second wire has a second bending structure,
    wherein under an influence of the first bending structure and the second bending structure, a difference value between a total length of the first wire and a total length of the second wire is greater than a predetermined length.

2. The layout structure of the differential lines of claim 1, wherein the first bending structure and the second bending structure are configured to jointly affect endpoint voltages of the first wire and the second wire.

3. The layout structure of the differential lines of claim 1, wherein an arrangement of the first bending structure and the second bending structure is not for bypass of a specific component.

4. The layout structure of the differential lines of claim 1, wherein a length of the first bending structure in a first direction is not greater than a first threshold value, and a length of the first bending structure in a second direction is not greater than a second threshold value, and the first direction is perpendicular to the second direction.

5. The layout structure of the differential lines of claim 4, wherein the first direction is parallel to a wiring direction of the first wire.

6. The layout structure of the differential lines of claim 1, wherein the first end of the first wire and the first bending structure are located in a first area of the first wire, and a coverage range of the first area occupies a predetermined proportion of a total length of the first wire.

7. A memory storage device, comprising:
    a layout structure of differential lines; and
    a rewritable non-volatile memory module coupled to the layout structure of the differential lines, wherein the layout structure of the differential lines comprises:
        a wiring layer;
        a first wire arranged on the wiring layer and configured to transmit a first differential signal; and
        a second wire arranged on the wiring layer and configured to transmit a second differential signal, wherein a first end of the first wire and a first end of the second wire are coupled to a first electrical component, a second end of the first wire and a second end of the second wire are coupled to a second electrical component, the first end of the first wire has a first bending structure and one of the second end of the first wire and the second end of the second wire has a second bending structure,
    wherein under an influence of the first bending structure and the second bending structure, a difference value between a total length of the first wire and a total length of the second wire is greater than a predetermined length.

8. The memory storage device of claim 7, wherein the first bending structure and the second bending structure are configured to jointly affect endpoint voltages of the first wire and the second wire.

9. The memory storage device of claim 7, wherein an arrangement of the first bending structure and the second bending structure is not for bypass of a specific component.

10. The memory storage device of claim 7, wherein a length of the first bending structure in a first direction is not greater than a first threshold value, and a length of the first bending structure in a second direction is not greater than a second threshold value, and the first direction is perpendicular to the second direction.

11. The memory storage device of claim 10, wherein the first direction is parallel to a wiring direction of the first wire.

12. The memory storage device of claim 7, wherein the first end of the first wire and the first bending structure are located in a first area of the first wire, and a coverage range of the first area occupies a predetermined proportion of a total length of the first wire.

13. A memory control circuit unit configured to control a rewritable non-volatile memory module, and the memory control circuit unit comprising:
    a layout structure of differential lines comprising:
        a wiring layer;
        a first wire arranged on the wiring layer and configured to transmit a first differential signal; and
        a second wire arranged on the wiring layer and configured to transmit a second differential signal, wherein a first end of the first wire and a first end of the second wire are coupled to a first electrical component, a second end of the first wire and a second end of the second wire are coupled to a second electrical component, the first end of the first wire has a first bending structure and one of the second end of the first wire and the second end of the second wire has a second bending structure,
    wherein under an influence of the first bending structure and the second bending structure, a difference value between a total length of the first wire and a total length of the second wire is greater than a predetermined length.

14. The memory control circuit unit of claim 13, wherein the first bending structure and the second bending structure are configured to jointly affect endpoint voltages of the first wire and the second wire.

15. The memory control circuit unit of claim 13, wherein an arrangement of the first bending structure and the second bending structure is not for bypass of a specific component.

16. The memory control circuit unit of claim 13, wherein a length of the first bending structure in a first direction is not greater than a first threshold value, and a length of the first bending structure in a second direction is not greater than a second threshold value, and the first direction is perpendicular to the second direction.

17. The memory control circuit unit of claim 16, wherein the first direction is parallel to a wiring direction of the first wire.

18. The memory control circuit unit of claim 13, wherein the first end of the first wire and the first bending structure are located in a first area of the first wire, and a coverage range of the first area occupies a predetermined proportion of a total length of the first wire.

\* \* \* \* \*